United States Patent [19]

Uchida et al.

[11] 4,107,772
[45] Aug. 15, 1978

[54] CHOPPER CONTROL DEVICE

[75] Inventors: Ryohei Uchida; Satoshi Utsumi, both of Himeji; Masahiko Akamatsu, Amagasaki, all of Japan

[73] Assignee: Mitsubishi Denki Kabushiki Kaisha, Tokyo, Japan

[21] Appl. No.: 741,673

[22] Filed: Nov. 15, 1976

[30] Foreign Application Priority Data

| Nov. 14, 1975 | [JP] | Japan | 50-137497 |
| Nov. 26, 1975 | [JP] | Japan | 50-141404 |
| Dec. 3, 1975 | [JP] | Japan | 50-144173 |
| Aug. 25, 1976 | [JP] | Japan | 51-102004 |
| Aug. 25, 1976 | [JP] | Japan | 51-102005 |

[51] Int. Cl.² .................................. H02M 7/515
[52] U.S. Cl. ...................... 363/124; 363/135
[58] Field of Search ............ 307/240, 252 M; 363/18, 363/19, 20, 21, 27, 124, 135; 323/17

[56] References Cited

U.S. PATENT DOCUMENTS

| 3,461,377 | 8/1969 | Reese | 323/17 X |
| 3,551,744 | 12/1970 | Keller et al. | 307/252 M |
| 3,697,851 | 10/1972 | Mast | 363/21 |
| 3,732,006 | 5/1973 | Howard | 307/252 M X |
| 3,745,377 | 7/1973 | Johnson | 307/240 X |
| 3,793,538 | 2/1974 | Rogers | 307/252 M |

*Primary Examiner*—William M. Shoop
*Attorney, Agent, or Firm*—Oblon, Fisher, Spivak, McClelland & Maier

[57] ABSTRACT

A chopper control device is disclosed, comprising: a series circuit having a dc power source, a dc load, and a thyristor; a transistor connected in parallel to the thyristor; a current transformer having a primary winding for detecting the load current; and another transistor for deriving a current from a secondary winding of the current transformer and supplying it to the base of the transistor.

20 Claims, 32 Drawing Figures

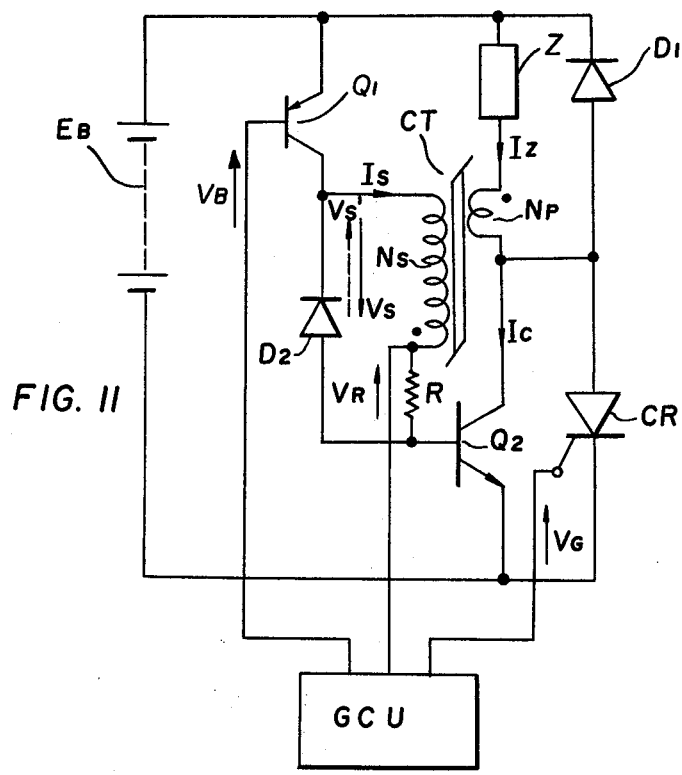
FIG. 11
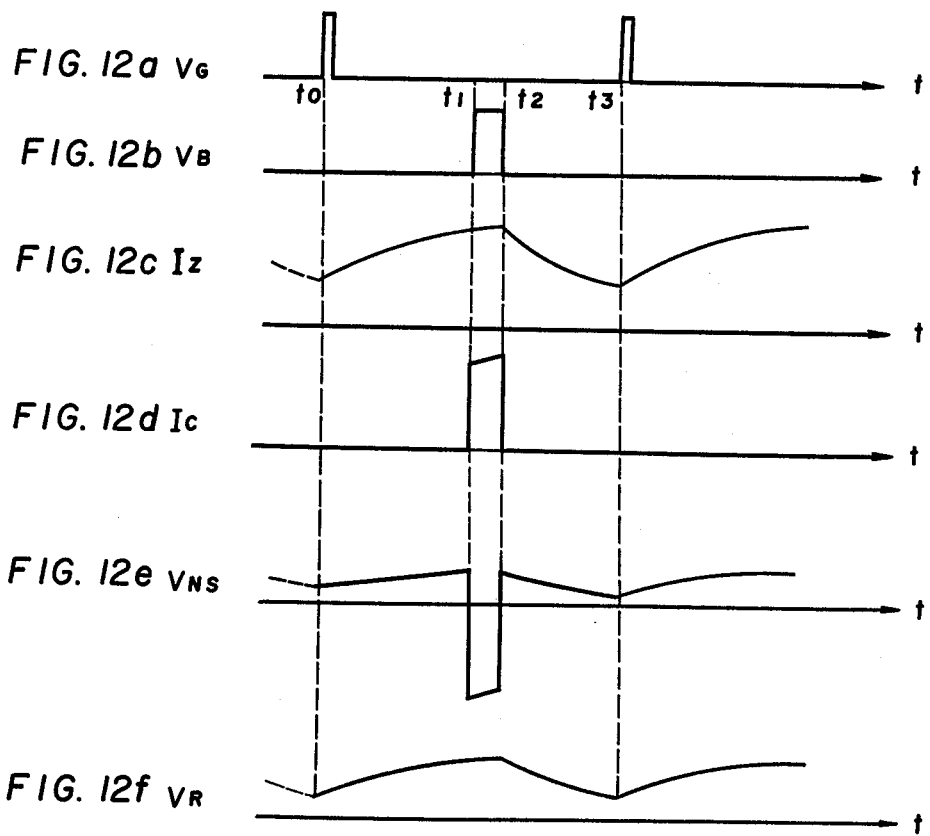
FIG. 12a $V_G$
FIG. 12b $V_B$
FIG. 12c $I_Z$
FIG. 12d $I_C$
FIG. 12e $V_{NS}$
FIG. 12f $V_R$

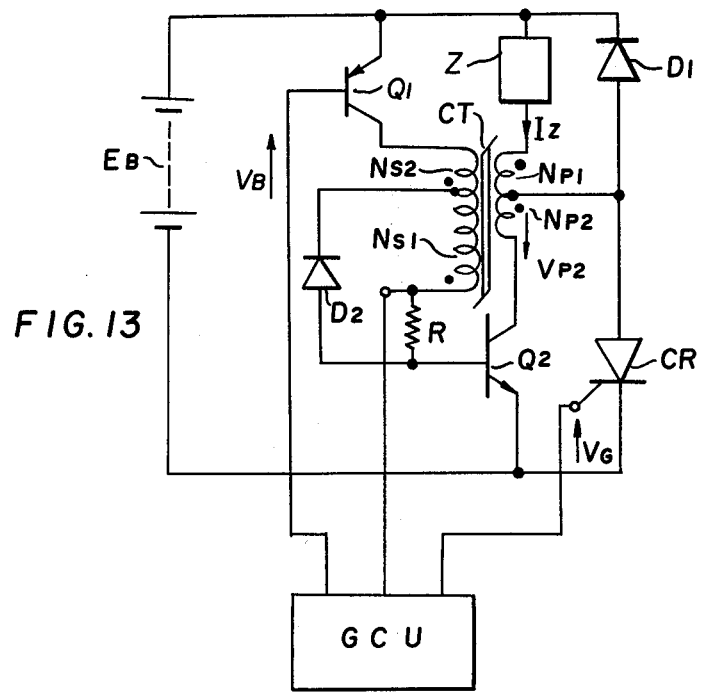
FIG. 13
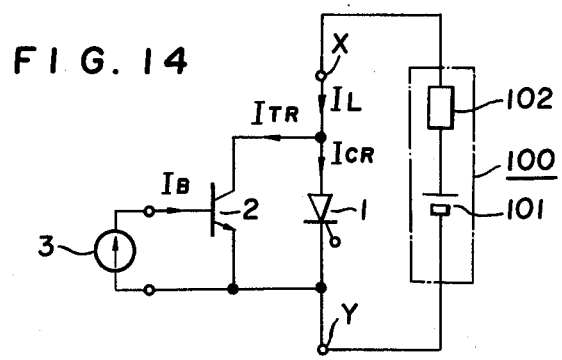
FIG. 14
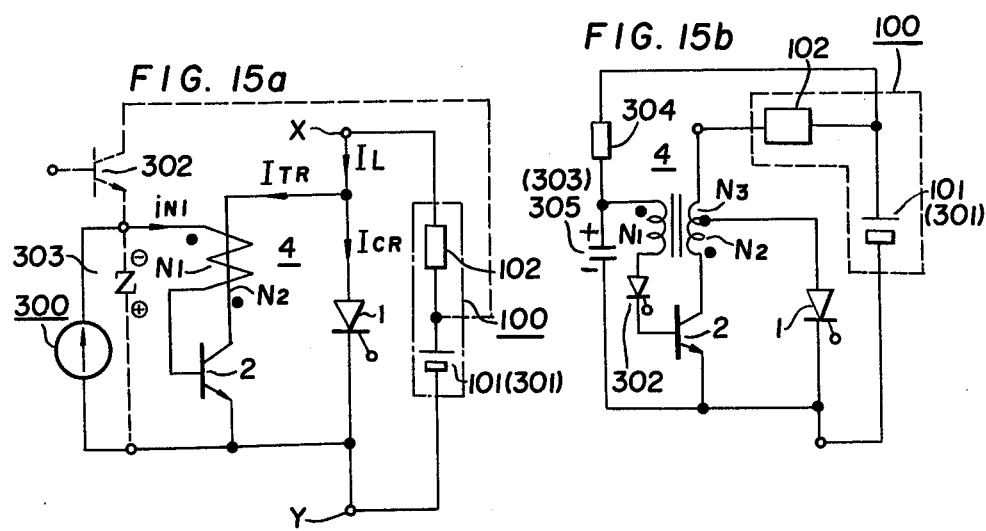
FIG. 15a
FIG. 15b

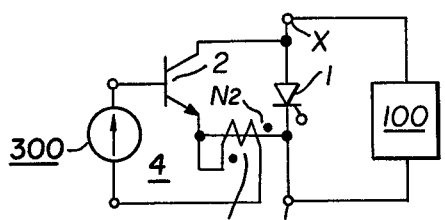
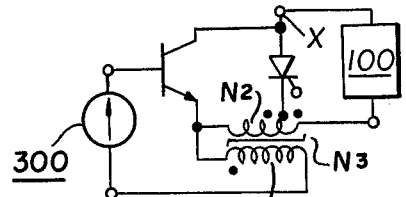
FIG. 16a  FIG. 16b
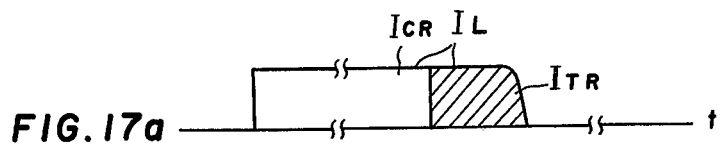
FIG. 17a
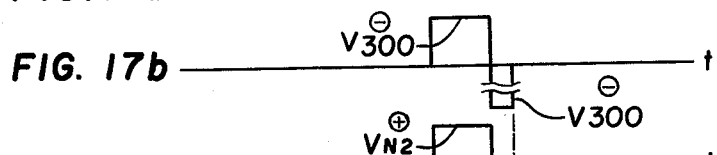
FIG. 17b
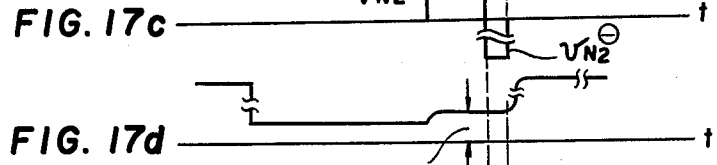
FIG. 17c
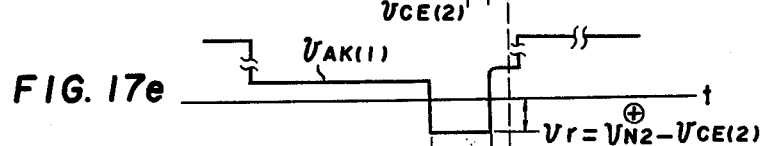
FIG. 17d
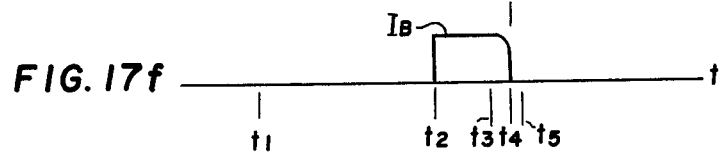
FIG. 17e
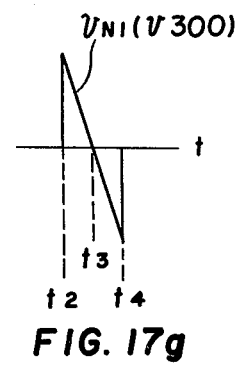
FIG. 17g
FIG. 17f
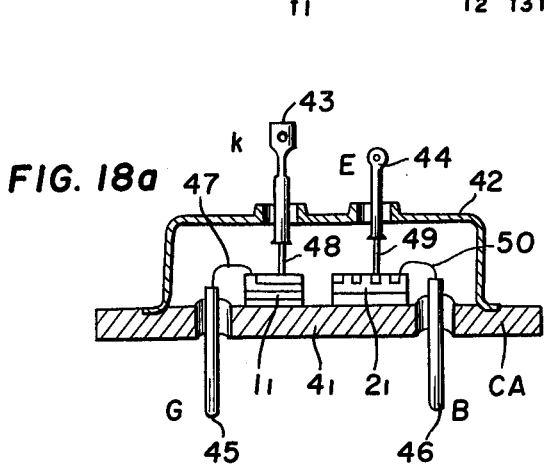
FIG. 18a
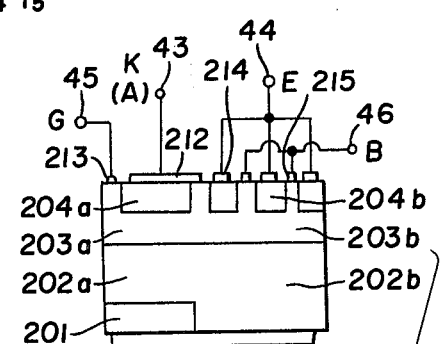
FIG. 18b

CHOPPER CONTROL DEVICE

BACKGROUND OF THE INVENTION

Thyristor choppers have been in use as means for controlling the dc load of a dc machine such as a dc motor. Such thyristor chopper consists essentially of a main control thyristor and a commutation circuit for turning this thyristor off. Heretofore a variety of commutation circuits have been used in practical applications, consisting essentially of a commutation capacitor, a commutation reactor, and an auxiliary commutation thyristor. In this commutation circuit, the load current is diverted to the commutation capacitor for a given period of time to turn off the main control thyristor. To this effect, therefore, the commutation capacitor and the commutation reactor must have a sufficient capacity so that a current not less than the load current can flow for a given period of time. This, on the other hand, has necessitated increase in the size of the constituent elements and lowered the chopper efficiency. Furthermore, this type of chopper cannot be used at high frequencies because the commutation must take place at the charge-discharge cycle of the commutation capacitor.

Prior art techniques have provided current feedback type transistor choppers in which part of the load current is supplied to the base of the main control transistor through a current transformer to turn on this transistor, and the current transformer is reset by the load commutation current while the main control transistor is in the off state. In this type of chopper, although the operating efficiency is fairly high since the base current of the main control transistor is limited to a value corresponding to the load current, the transformer is disabled when it is saturated, with the result that the transistor becomes nonconducting, because the transistor depends for its base current upon the transformer. In other words, the time for which the transistor is on is limited due to saturation in the transformer. This has hampered prior art techniques from realizing a chopper device operable with full commutation efficiency. The present invention obviates the foregoing prior art drawbacks.

SUMMARY OF THE INVENTION

An object of the invention is to provide a chopper device having a commutation circuit small in size and operable with high efficiency without using the commutation capacitor and the commutation reactor.

Another object of the invention is to provide a chopper device comprising a commutation transistor, a capacitor small in capacitance used in the base circuit of the transistor, and a current transformer for limiting the transistor base current to a minimum, thus enabling the chopper device to be operated with high commutation efficiency.

Another object of the invention is to provide a chopper device capable of being continually conducting and operable as an efficient chopper.

Another object of the invention is to provide a chopper device operable without the need for the commutation capacitor, small in size, manufacturable at low costs, allowing commutation with a minimum of loss, and capable of efficiently and securely detecting the load current by simple arrangement without using a particular current detector, wherein the main circuit is controlled by the detected current.

DESCRIPTION OF THE DRAWINGS

FIG. 11 is a circuit diagram showing a chopper control device of the invention, FIGS. 12(a) to 12(f) are timing charts for illustrating operations of the device shown in FIG. 11, FIG. 13 is a circuit diagram showing another embodiment of the invention, FIG. 14 is a circuit diagram showing a prior art semiconductor switch, FIGS. 15(a) and 15(b) are circuit diagrams showing other embodiments of the invention, FIGS. 16(a) and 16(b) are circuit diagrams showing other embodiments of the invention, FIGS. 17(a) to 17(g) are waveform diagrams for illustrating operational principles of the device of the invention, and FIGS. 18(a) and 18(b) are sectional diagrams showing constructional features of devices composed of a transistor and a thyristor in combination according to the invention.

DESCRIPTION OF THE INVENTION

Figure 1:
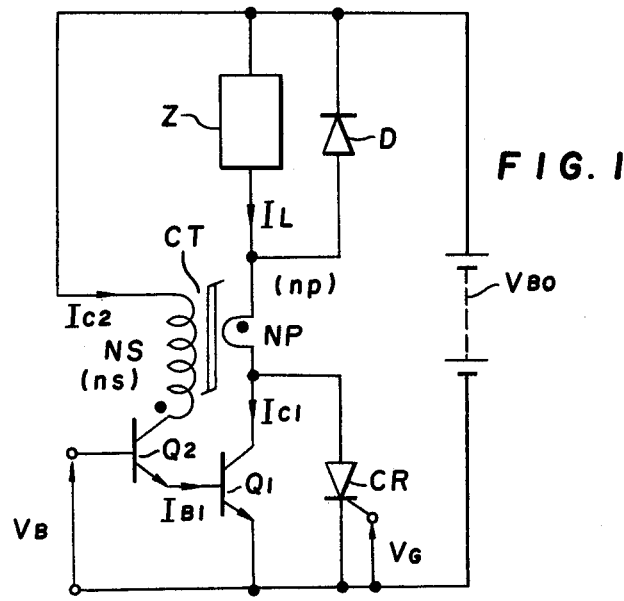
FIG. 1 is a circuit diagram showing one embodiment of the invention.

With reference to FIG. 1, there is shown a circuit diagram of chopper device of the invention, comprising a dc power source $VB_O$, a dc load Z, a main control thyristor CR, a commutation transistor $Q_1$, a transistor $Q_2$ for driving the base of transistor $Q_1$, and a current transformer CT having a primary winding $N_p$ and a secondary winding $N_s$.

Figure 2:
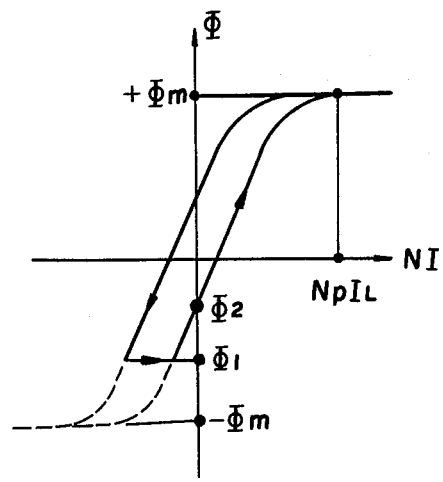
FIG. 2 is a graphic diagram showing magnetization curves plotted for a current transformer.

When a trigger signal $V_G$ is applied to the gate of thyristor CR, a load current $I_L$ starts flowing by way of the dc power source $VB_O$, the dc load Z, the primary winding $N_p$ of transformer CT, and the thyristor CR. In this state, the flux from the transformer CT moves to a positive saturation point $+\phi_m$ corresponding to the load current $I_L$ as shown in FIG. 2. To make the thyristor CR nonconducting after the lapse of a predetermined period of conduction, a pulse turn-off signal $V_B$ is applied to the transistor $Q_2$. The pulse duration of signal $V_B$ is determined to be slightly longer than the turn-off time of thyristor CR. With the turn-off signal $V_B$ applied, the transistor $Q_2$ turns on, causing a collector current $I_{C2}$ to flow by way of the dc power source $VB_O$, the secondary winding $N_s$ of the transformer CT, the collector-emitter of transistor $Q_2$, and the base-emitter of transistor $Q_1$. By the collector current $I_{C2}$ (i.e., the base current of transistor $Q_1$), the transformer CT is excited in the direction opposite to the flux $+\phi_m$ resulting from the load current $I_L$. As a result, the flux from the core of transformer CT moves toward $-\phi_m$. In this state, the law of isoampere-turn holds with respect to the transformer CT and hence the base current $I_{B1}$ of transistor $Q_1$ is given as $I_{B1} = \alpha I_L$, where $\alpha$ is the current ratio, $n_p/n_s$, of the transformer CT of which the numbers of turns of primary and secondary windings are $n_p$ and $n_s$ respectively. The current ratio $\alpha$ is determined to be $1/\alpha < \beta$ where $\beta$ is the current amplification factor of transistor $Q_1$. Accordingly the transistor $Q_1$ turns on to take over the load current $I_L$ which has been flowing in the thyristor CR. The transistor $Q_1$ is driven so that the collector-emitter saturation voltage $V_{CE(SAT)}$ of transistor $Q_1$ becomes lower than the forward voltage $V_F$ of thyristor CR, causing all the load current $I_L$ to be diverted to the transistor $Q_1$. As a result, the anode current of thyristor CR is lowered below the holding current. When the turn-off signal $V_B$ vanishes, both transistors $Q_1$ and $Q_2$ become nonconducting and the thyristor CR becomes also nonconducting. The load current $I_L$ is diverted to commutation diode D. At the instant the load current is diverted to the diode D, the core flux moves along the arrow-marked path from $-\phi_1$ to $-\phi_2$ (FIG. 2) and remains in this state. Then, when another trigger signal $V_G$ is applied to the gate of thyristor CR, the thyristor turns on, the load current $I_L$ flows in the same path as described above, and the core flux moves in the arrow-marked direction from $-\phi_2$ to $+\phi_m$ corresponding to the load current $I_L$. Repeating a series of these operations, the chopper device performs chopper functions.

According to the invention, as disclosed above, the transformer CT is controlled so that a current corresponding to the load current is supplied to the base of transistor $Q_1$ for a very short time which, however, is slightly longer than the turn-off time of the thyristor at commutation. As a result, loss ascribed to commutation is reduced and chopper efficiency is increased. Furthermore, the period of commutation can be arbitrarily determined in response to the load current since the period of commutation depends on the pulse width of turn-off signal $V_B$ applied to the transistor $Q_2$, although the maximum commutation period depends on the saturation of the transformer CT. Still further, the chopper device of the invention obviates the need for the commutation capacitor which has been indispensable for prior art commutation in a thyristor chopper, and can be constructed with a minimum number of constituent elements such as a current transformer CT, a commutation transistor of short time-constant, and a transistor for driving the commutation transistor, thus permitting the chopper device to be fabricated into a small size. Still further, design freedom is enhanced in the chopper device of the invention, as opposed to the fact that the prior art chopper device must be designed with power source voltage fluctuations in mind because variations in the power source voltage with which the commutation capacitor is charged affects the commutation current to a considerable extent especially when the power source is of a battery. Still furthermore, the chopper device of the invention can be used in high frequency applications because the period of commutation is extremely short as described above. In short, the chopper device of the invention makes distinct advantages available without the need for cost considerations and extra design efforts.

Figure 3:
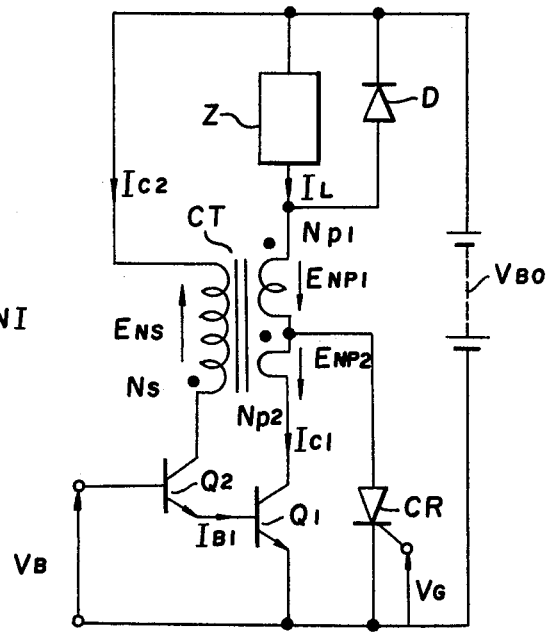
FIG. 3 is a circuit diagram showing another embodiment of the invention.

Referring to FIG. 3, a circuit diagram is shown to illustrate another embodiment of the invention in which the transformer CT has a third winding $N_{p2}$ and an electromotive force produced across this winding is utilized to enable the commutation to occur securely. Assume the thyristor CR is conducting. When a signal $V_B$ is applied to turn off the thyristor CR, the transistor $Q_2$ turns on, a collector current $I_{C2}$ flows corresponding to the load current $I_L$, and the transistor $Q_1$ turns on, causing the load current to be ready to be commutated. In this state, an electromotive force $E_{NS}$ is developed across the secondary winding of transformer CT in the arrow-marked direction. Accordingly an electromotive force $E_{NP2}$ is produced across the tertiary winding in the arrow-marked direction. The electromotive force $E_{NP2}$ serves to lower the potential between the anode and the cathode of thyristor CR. As a result, the load current $I_L$ becomes ready to be quickly diverted to the transistor $Q_1$. At this moment, the transformer CT is further excited by the collector current $I_{C1}$ which flows in the winding $N_{P2}$, and the base current in the transistor $Q_1$ further increases according to the value $I_{C1} \times N_{P2}$. Consequently, the transistor $Q_1$ accelerates its conduction and urges the commutation to an end. As disclosed above, the invention makes it possible to realize a chopper device operable with high efficiency and constructed into a small size.

Figure 4:
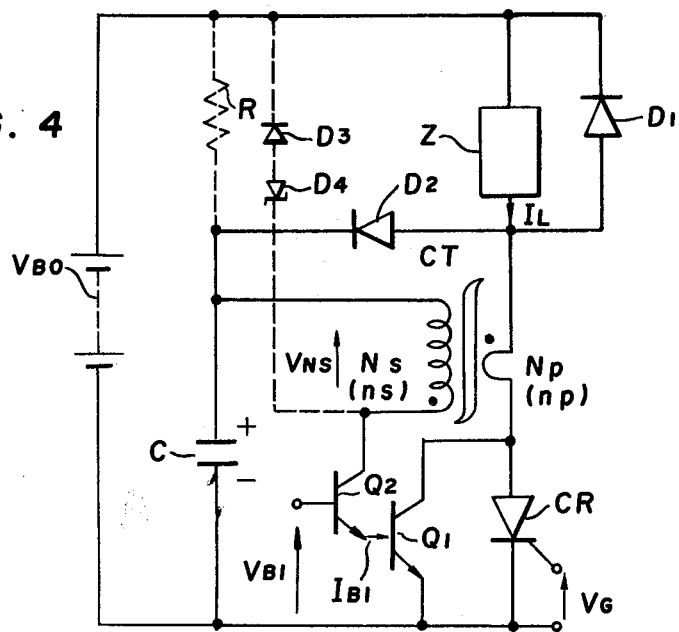
FIGS. 4, 5 and 6 are circuit diagrams showing other embodiments of the invention.
Figure 7:
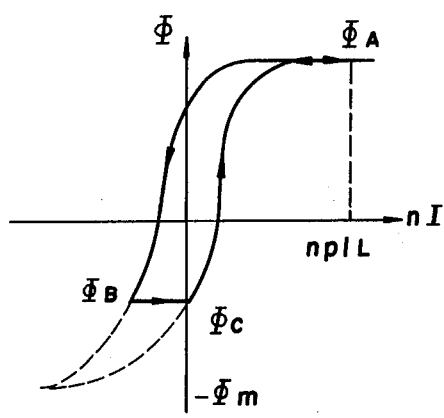
FIG. 7 is a graphic diagram showing magnetization curves plotted for a current transformer used in the circuits shown in FIGS. 4 to 6, FIGS. 8 and 9 are circuit diagrams showing other embodiments of the invention.

Referring to FIG. 4, a circuit diagram is shown to illustrate another embodiment of the invention, which comprises a dc power source $V_{BO}$, a dc load Z, a commutation diode $D_1$, a thyristor CR, a current transformer CT having a primary winding $N_p$ and a secondary winding $N_s$, a commutation transistor $Q_1$, a control transistor $Q_2$, a capacitor C, and a diode $D_2$. This circuit operates in the following manner. When a gate signal $V_G$ is applied to the gate of main control thyristor CR, the thyristor CR turns on, and a load current $I_L$ starts flowing by way of the dc power source $V_{BO}$, the dc load Z, the primary winding $N_p$ of transformer CT, the thyristor CR, and the dc power source $V_{BO}$, and thus power is supplied to the dc load Z. At this moment, the core of transformer CT is excited by the load current, and the flux $\phi$ moves to point $\phi_A$ (FIG. 7) corresponding to the product $n_p \cdot I_L$ where $n_p$ is the number of turns of primary winding $N_p$ and $I_L$ is the load current. Before the thyristor CR is turned off, the capacitor C is required to be charged through auxiliary charging resistor R indicated by the broken line in FIG. 1. In this state, a control signal $V_{B1}$ is applied to the base of transistor $Q_2$, causing this transistor to turn on. At the same time, a positive charge goes to the base of transistor $Q_1$ from the capacitor C through the secondary winding $N_S$ of transformer CT. A voltage $V_{NS}$ nearly the same as the voltage stored across the capacitor C is applied to the secondary winding $N_S$ in the direction shown in FIG. 4. As a result, the transformer CT is excited in the direction opposite to the direction in which the transformer CT has been excited by the load current, causing the flux from the core to be ready to move toward $-\phi_m$. When the flux enters the nonsaturation region, the law of isoampere turn holds whereby the base current $I_{B1}$ is limited to a value proportional to the load current which depends on the current ratio of transformer CT. The current ratio K is determined to satisfy the condition $\beta > K$ where $\beta$ is the current amplification factor of transistor $Q_1$, and K is the ratio of the number of turns of secondary winding to that of primary winding, $n_s/n_p$. Under this condition, the transistor $Q_1$ turns on by the base current $I_{B1}$. When the resultant collector-emitter saturation voltage $V_{CE(SAT)}$ is lower than the forward voltage $V_{AK}$ of thyristor CR, all the load current $I_L$ is commutated to the transistor $Q_1$. After the lapse of time necessary for the thyristor CR to turn off, the control signal $V_{B1}$ is stopped. This causes both transistors $Q_1$ and $Q_2$ and thyristor CR to be turned off. As a result, the load current $I_L$ charges the capacitor C by way of the dc power source $V_{BO}$, the dc load Z and the diode $D_2$. When the capacitor C is charged to a value nearly equal to the dc power source voltage, the load current $I_L$ is diverted to the commutation diode $D_1$. At the same time, the flux from the core of transformer CT moves to point $\phi_C$ (FIG. 7) because no excitation is present on the transformer CT from point $\phi_B$ immediately before the transistor $Q_1$ turns off. When the thyristor CR is turned on by another gate signal $V_G$, the load current $I_L$ starts flowing by way of the dc power source $V_{BO}$, the dc load Z, and the primary winding $N_P$ of transformer CT, thereby supplying power to the load. Concurrently, the flux from the core of the transformer CT is reset to point $\phi_A$ which corresponds to the product of the load current $I_L$ and the number of turns $n_p$ of primary winding of transformer CT. In this state, it is likely that a high voltage is induced across the secondary winding $N_S$ for a short time due to an increment of current in the primary winding $N_P$. This high voltage can be bypassed through diode $D_3$ and zener diode $D_4$ as indicated by the dotted line in FIG. 4 or removed by connecting a capacitor-resistor series circuit in parallel to the secondary winding $N_S$. The chopper device performs chopper operation by repeating a series of the foregoing operations.

According to the invention, as described above, the charge Q required to be released from the capacitor C to effect the commutation can be reduced, or the capacity of the capacitor C may be 1/K as small as that of the commutation capacitor used in the prior art device. That is, $$Q \simeq \frac{I_L \times t_{OFF}}{K}$$

where

K: current ratio of transformer CT (K > 1)
$t_{OFF}$: turn-off time needed for thyristor In other words, the size of the capacitor C can be considerably reduced and the chopper device can be constructed into a smaller size. Furthermore, the commutation efficiency can be increased by virtue of the fact that the base current to the commutation transistor $Q_1$ at commutation is limited to a minimum proportional to the load current due to the function of transformer CT. When the time for which the signal $V_{B1}$ is applied is made coincident with the time $t_{OFF}$, the discharge current from the capacitor C is reduced with decrease in the load current. This, together with the fact that the charging current goes to the capacitor C through the load Z, contributes to enhancing the efficiency of the device.

Figure 5:
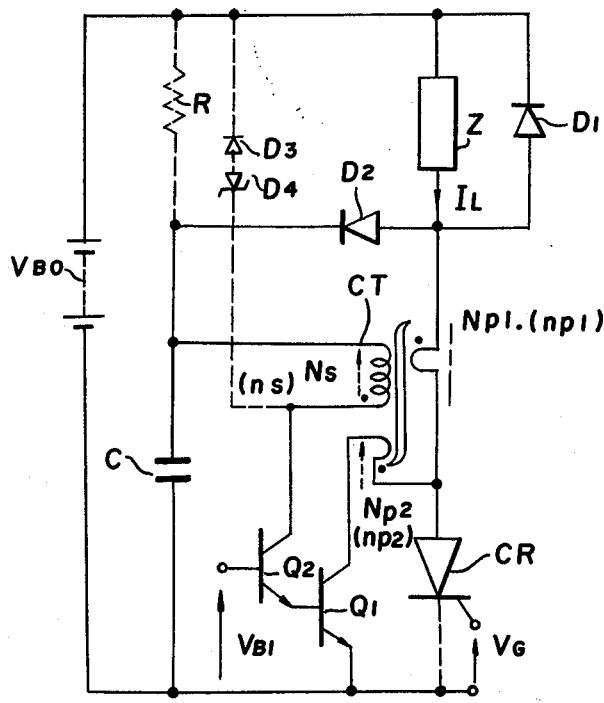

With reference to FIG. 5, there is shown a circuit diagram for illustrating another embodiment of the invention, in which the transformer CT is provided with a third winding $N_{P2}$ in addition to winding $N_{P1}$, and this third winding is connected to the collector of commutation transistor $Q_1$ in the polarity indicated therein, to permit commutation to be carried out securely. When a control signal $V_{B1}$ is applied while the thyristor CR is in the on state, the transistor $Q_2$ turns on, and a current proportional to the load current which depends on the current ratio $K_1$ of transformer CT ($K_1 = n_s/n_{p1}$ wherein $n_{p1}$ is the number of turns of winding $N_{P1}$) flows in the base of commutation transistor $Q_1$ from the capacitor C by way of the secondary winding $N_S$ of transformer CT and the transistor $Q_2$. As a result, the commutation transistor $Q_1$ is ready to turn on and an electromotive force with its negative polarity indicated by a dot in FIG. 5 is induced across the transformer winding. The electromotive force developed across the third winding $N_{P2}$ causes the commutation transistor $Q_1$ to pull in the load current which has been flowing in the thyristor CR. When the load current starts flowing in the commutation transistor $Q_1$, the transformer CT is further excited by the collector current of transistor $Q_1$, with the result that the current in the secondary winding, i.e., the base current of transistor $Q_1$, increases according to the ampere-turn product on the transformer CT and the load current is diverted to the commutation transistor $Q_1$ in a positive feedback manner. At the same time, the current $I_{CT2}$ of the secondary winding of transformer CT changes its value from $$I_{CT2} = I_L \times \frac{n_{p1}}{n_s} \text{ (the}$$

value when all the load current flows in the thyristor CR) to $$I_{CT2} = I_L \times \frac{n_{p1} + n_{p2}}{n_s}$$

(the value when the current in the thyristor CR is cut off). During this transition, the stored carrier unloading current from the thyristor CR is added to the load current through the winding $N_{P2}$. The resultant current is likely to become larger than the secondary winding current $$I_{CT2} (= I_L \times \frac{n_{p1} + n_{p2}}{n_s}).$$

In this embodiment, the time constant of the load Z is longer than the turn-off time of the thyristor CR and hence the load in commutation operation is considered as a constant current source. Briefly, as described above, the transformer CT is provided with a third winding which is connected in series to the collector of commutation transistor $Q_1$ and the electromotive force induced across the winding is utilized to securely commutate the load current to the transistor $Q_1$ and the thyristor CR is turned off.

Figure 6:
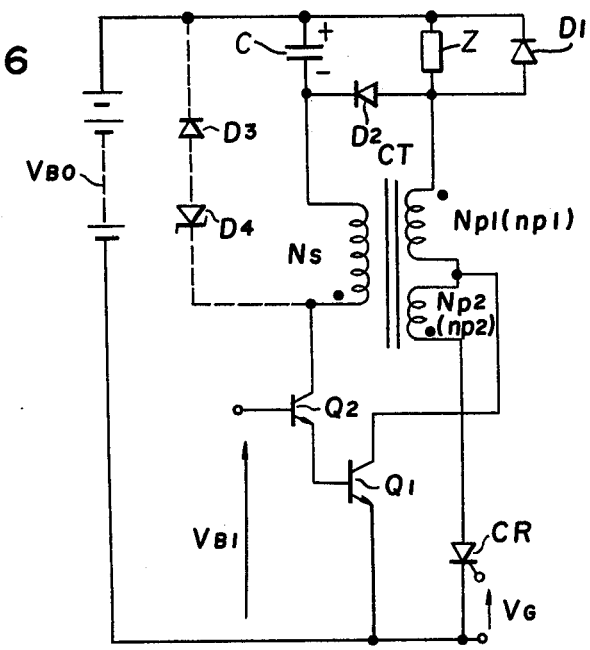

With reference to FIG. 6, there is shown a circuit diagram for illustrating another embodiment of the invention which is similar to the one shown in FIG. 5, except the capacitor C is connected to the positive side of the dc power source $V_{BO}$, and the transformer CT is provided with windings $N_{P1}$ and $N_{P2}$ different from those shown in FIG. 5. When the thyristor CR turns on, the load current $I_L$ flows serially in the windings $N_{P1}$ and $N_{P2}$. Because the two windings are opposite to each other with respect to polarity, the transformer CT is reset according to the load current $I_L$ and the difference in the number of turns between the two windings. (Assume $n_{p1} > n_{p2}$.) When the transistor $Q_1$ is turned on by the signal $V_{B1}$, the current for charging the capacitor C goes to the secondary winding $N_S$ of transformer CT. This current is reduced in the ratio of the primary current to the turn ratio. The resultant current is supplied to the base of the auxiliary commutation transistor $Q_1$. A voltage induced across the winding $N_{P2}$ is reversely applied to the thyristor CR to cause this thyristor to be turned off. When the signal $V_{B1}$ ceases, the charge stored in the capacitor C is released to flow as the load current. When the charge across the capacitor C reaches nearly zero, the load current $I_L$ is commutated through the diode $D_1$. In this embodiment, because the thyristor CR is turned off while the charge across the capacitor C is zero, the need for preliminarily charging the capacitor C through the resistor R (FIGS. 4 and 5) is obviated. Briefly, as described above, a capacitor is connected to the base of commutation transistor and thus the capacity of the capacitor is reduced. Further, the base current of the commutation transistor is limited to a minimum by virtue of the function of transformer CT and commutation efficiency is improved accordingly.

Figure 8:
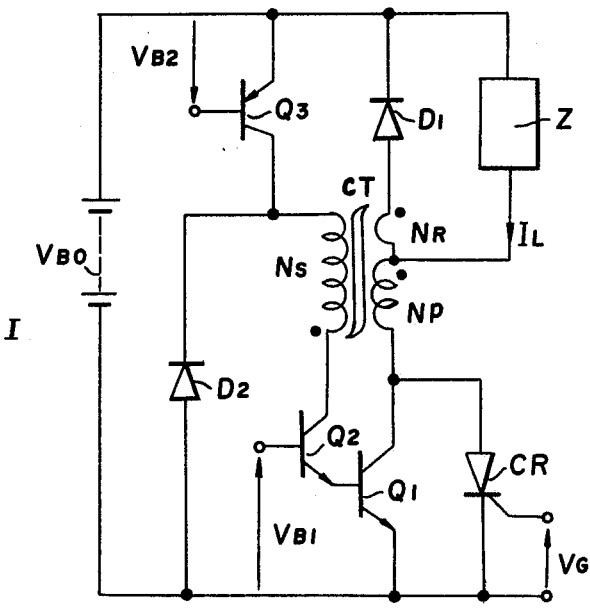
Figure 10:
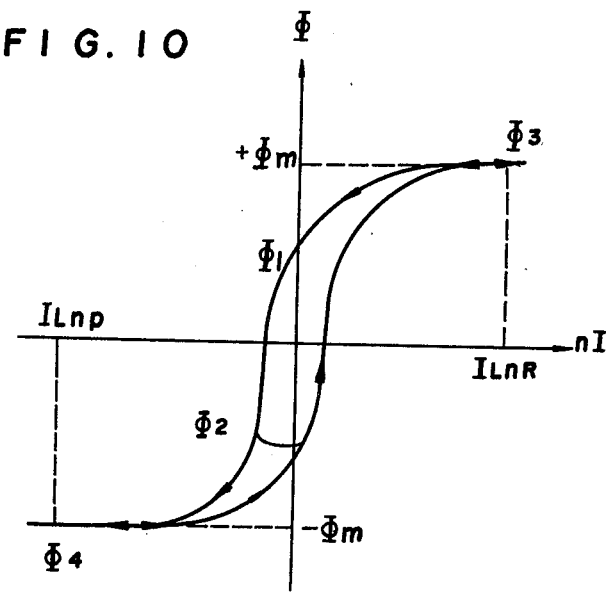
FIG. 10 is a graphic diagram showing magnetization curves plotted for a current transformer used in the circuits shown in FIGS. 8 and 9.

Referring to FIG. 8, a circuit diagram is shown for illustrating another embodiment of the invention, which comprises a dc power source $V_{BO}$, a dc load (inductive load) Z, a commutation diode $D_1$, a main control transistor $Q_1$, a transistor $Q_2$ for controlling the transistor $Q_1$, a current transformer CT having a primary winding $N_P$ for detecting the load current, a reset winding $V_R$, and a secondary winding $N_S$, a diode $D_2$, a bypass thyristor CR, and a transistor $Q_3$. This chopper device operates in the following manner. When a control input $V_{B1}$ is applied, a load current $I_L$ is ready to flow in the transistor $Q_1$ by way of the dc power source $V_{BO}$, the dc load Z, and the primary winding $N_P$. At this moment, the flux $\phi$ from the core of the transformer CT moves toward point $-\phi_m$ from point $\phi_1$ (FIG. 10). During this flux transient to $-\phi_m$, the law of isoampere turn holds whereby a current corresponding to the current ratio of the secondary winding $N_S$ is ready to flow in the secondary winding $N_S$ by way of the collector-emitter of transistor $Q_2$, the base-emitter of transistor $Q_1$, and the diode $D_2$. Then assume that the current ratio K is determined so as to satisfy the condition $K < \beta$ where K is the ratio of the number of turns of secondary winding, $n_s$, to that of primary winding, $n_p$, i.e., $n_s/n_p$, and $\beta$ is the current amplification factor of transistor $Q_1$. Under this condition, the transistor $Q_1$ instantaneously conducts by positive feedback function effected by the transformer CT. When the control input $V_{B1}$ is cut off before the core flux reaches $-\phi_m$, the transistors $Q_1$ and $Q_2$ become both nonconducting, and the load current $I_L$ is becoming diverted to the commutation diode $D_1$ through the reset winding $N_R$ by the inductive component of the dc load Z. Because the reset winding $N_R$ is excited opposite to the primary winding $N_P$ with respect to polarity as indicated by the dot in FIG. 8, the core flux quickly reaches $+\phi_m$ from point $\phi_2$ at which the load current starts commutating. Thereafter the operating point goes over the excitation point $\phi_3$ which corresponds to the product of the load current $I_L$ and the number of turns of reset winding, $n_R$.

When another control input $V_{B1}$ is applied, the transistor $Q_1$ is becoming conducting to allow the load current $I_L$ to flow. When the core flux moves from the saturation region to the nonsaturation region of $\phi_3$, the transistor $Q_1$ fully turns on by the current flowing as the result of positive feedback through transformer function. Repeating a series of the above operations, the chopper device operates efficiently. Note that in the above operation mode, the time for which the transistor $Q_1$ is conducting must be within the time required for the core flux to reach $-\phi_m$, because if the transformer core is saturated, the transformer loses its function and the transistor $Q_1$ can become nonconducting. The control input $V_{B1}$ is supplied to keep the control transistor $Q_2$ saturated, and hence its value may be small.

By reasons described above, the transistor chopper device having no thyristor is incapable of allowing the main control transistor $Q_1$ to remain continually conducting.

While, in FIG. 8, a load current can be supplied continually to the dc load Z by applying a gate signal $V_G$ to the thyristor CR. In other words, the gate signal $V_G$ turns on the thyristor, causing the load current $I_L$ to flow for a desired period of time by way of the dc power source $V_{BO}$, the dc load Z, the primary winding $N_P$ of transistor CT, and the thyristor CR. In this state, the core flux reaches $-\phi_m$ and the operating point moves to excitation point $\phi_4$ corresponding to the product $I_L \times n_p$. To resume chopper operation, the control signal $V_{B1}$ is applied to the transistor $Q_2$ and the base signal $V_{B2}$ to the transistor $Q_3$ simultaneously, to cause a base current to flow in the transistor $Q_1$ from the dc power source $V_{BO}$ through the transistor $Q_3$, the secondary winding $N_S$, and the transistor $Q_2$. This base current excites the transformer in the direction where the core is reset and, as a result, the core flux returns to its nonsaturation region and is limited to a value $I_L/K$. Accordingly the transistor $Q_1$ turns on and allows the load current $I_L$ to be commutated from the thyristor CR. In this case, the current ratio K is determined so that the collector-emitter saturation voltage of transistor $Q_1$ is lower than the forward voltage of thyristor CR. When the control input $V_{B1}$ and the base signal $V_{B2}$ are cut off after the lapse of time required for the thyristor to turn off, both transistor $Q_1$ and thyristor CR becomes nonconducting and the load current $I_L$ is diverted to the commutation diode $D_1$. On the other hand, the core flux is moving toward $+\phi_m$ from $\phi_4$ by the power source voltage $V_{BO}$ applied across the secondary winding $N_S$. This flux, however, is reset to point $\phi_3$ as the result that the load current $I_L$ is diverted to the commutation diode $D_1$. When the control input $V_{B1}$ is applied again after the operation mode in which the thyristor CR is turned off, the circuit operates as a transistor chopper.

According to this embodiment, as described above, chopper operation is done by the main control transistor, and continuous load current is maintained through the thyristor. To resume chopper operation, the transformer CT is reset and a current is supplied to the base of main control transistor whereby the load current is commutated from the thyristor to the main control transistor. Thus, after the thyristor turns off, chopper operation is resumed smoothly.

In this embodiment, the power source $V_{BO}$ is used to turn off the thyristor CR. Instead of this power source, the other power sources, with their negative poles connected together, may be used. Also a thyristor may be used in place of the transistor $Q_3$. This thyristor turns off when the signal $V_{B1}$ is removed to cause the transistor $Q_2$ to be turned off.

Figure 9:
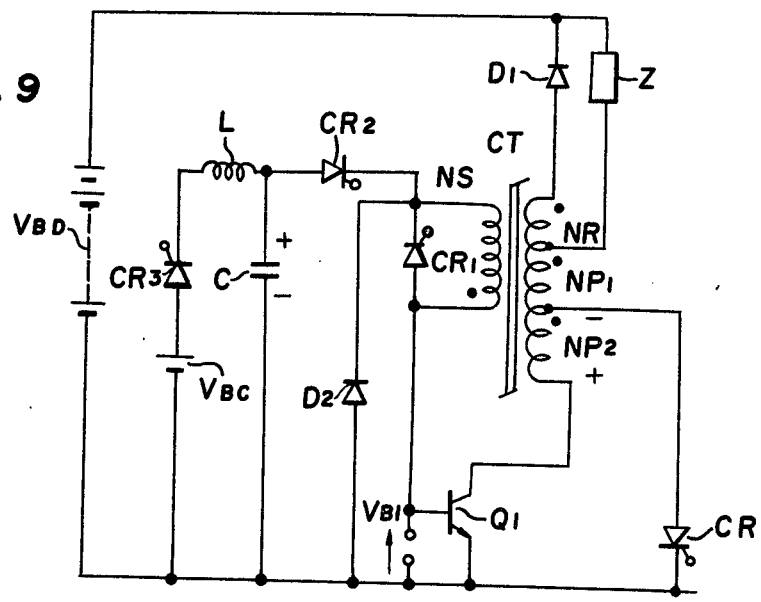

Referring to FIG. 9, there is shown a circuit diagram for illustrating another embodiment of the invention, which comprises a dc power source $V_{BC}$ having its negative pole connected to the negative pole of another dc power source $V_{BO}$, a reactor L, and control thyristors $CR_1$ to $CR_3$. This chopper device operates basically in the same manner as the one shown in FIG. 8. A signal $V_{B1}$ is applied to the base of the transistor $Q_1$, which is thereby turned on. This signal may be a pulse of short width. After the application of the pulse signal $V_{B1}$, a current is continuously supplied to the base of transistor $Q_1$ from the secondary winding $N_S$ as the result that a positively fed-back current flows in the secondary winding $N_S$ by transformer function effected between the primary winding ($N_{P1} + N_{P2}$) and the secondary winding $N_S$. When a gate signal is applied to the thyristor $CR_1$, this thyristor turns on, the current in the secondary winding $N_S$ bypassed through the thyristor $CR_1$ whose voltage drop is small, and the base current in the transistor $Q_1$ is cut off to cause this transistor to be turned off. As a result, the load current $I_L$ is commutated through the winding $N_R$ and the diode $D_1$, and the transformer CT is reset. To maintain continuous load current, the thyristor CR is turned on to cause the transformer CT to be set through the primary winding $N_{P1}$ and thereby to cause the core to be saturated. The thyristor CR is turned off in the following manner. The thyristor $CR_3$ is turned on by the power source $V_{BC}$, and the capacitor C is charged to the polarity (FIG. 9) by the LC resonant current. (Note: the thyristor $CR_3$ turns off when the resonant current ends.) When the thyristor $CR_2$ is turned on, the charge across the capacitor C is released by way of the thyristor $CR_2$, the secondary winding $N_S$, the base of transistor $Q_1$, the emitter of transistor $Q_1$ and the capacitor C. As a result, a voltage is applied across the secondary winding $N_S$ in the reset direction. The secondary current is limited to a value corresponding to the primary current in the primary windings $N_{P1}$ and $N_{P2}$. By this secondary current, the transistor $Q_1$ is turned on. The current flowing in the thyristor CR is bypassed to the transistor $Q_1$, and a voltage with a polarity shown in FIG. 9 is induced across the primary winding $N_{P2}$ corresponding to the voltage applied to the secondary winding $N_S$. This voltage serves as a reverse bias voltage to the thyristor CR, allowing all the load current to flow in the transistor $Q_1$, and the thyristor CR to turn off. Until the transformer CT is saturated, a current corresponding to the current ratio of ($N_{P1} + N_{P2}$) to $N_S$ is supplied to the transistor $Q_1$ through the capacitor C, the thyristor $CR_2$ and the secondary winding $N_S$. When the polarity of the voltage across the capacitor C is inverted, the inverted voltage is applied to the thyristor $CR_2$, which is thereby turned off. Thus the transistor chopper mode starts at a point between the secondary winding $N_S$ and the base of transistor $Q_1$. To terminate this mode, it is necessary to fire the thyristor $CR_1$. As described above, this circuit operates as a transistor chopper as the one shown in FIG. 1 and is capable of causing a voltage to be continually applied to the load through the thyristor, which can be turned off when necessary. The thyristor can be securely turned off by applying an inverted voltage through the primary winding $N_{P2}$. The thyristors $CR_1$ to $CR_3$ may be of relatively small capacity and are driven by a trigger signal only. This contributes to simplifying the control circuit. Briefly, according to this embodiment, the invention makes the chopper device capable of continuous flow of load current and copper operation as well.

Another embodiment of the invention will be described by referring to FIG. 11, in which a commutation transistor is installed in parallel to the main control thyristor, a base current corresponding to the load current is supplied through a current transformer to the commutation transistor for a given period of time in the commutation mode, and the main control thyristor is turned off by temporarily commutating the load current to the transistor. FIG. 11 is a circuit diagram showing the construction of this chopper device, which comprises a dc power source $E_B$ (e.g., battery) connected to a series circuit of dc load Z (e.g., motor), primary winding $N_P$ of current transformer CT, and main control thyristor CR. Further comprising are a freewheel diode $D_1$ parallel to a series circuit of the dc load Z and the primary winding $N_P$, a commutation transistor $Q_2$ parallel to the thyristor CR, and a transistor $Q_1$ for controlling the base current of transistor $Q_2$. The transistor $Q_1$ has its emitter connected to the positive pole of dc power source $E_B$, its collector to the secondary winding $N_S$ of transformer CT, and its base to a control device GCU. The transformer CT has the primary winding $N_P$ for detecting the load current and the secondary winding $N_S$ with one end connected to the transistor $Q_1$ and the other end connected through a resistor R to the base of transistor $Q_2$. A diode $D_2$ is connected in parallel to a series circuit of the primary winding $N_P$ and the resistor R. The resistor R is used for detecting the load current, and the diode $D_2$ is used for passing the secondary winding current. The junction between the secondary winding $N_S$ and the resistor R is connected to the control device GCU. A base current is supplied to the transistor $Q_2$ by way of the series circuit of secondary winding $N_S$ and resistor R. A gate signal is applied to the thyristor CR from the control device GCU.

FIG. 12 is a timing chart for illustrating operations of the circuit shown in FIG. 11, in which (a) is gate signal voltage $V_G$ to the thyristor CR; (b), base voltage $V_B$ to the transistor $Q_1$; (c), load current $I_Z$ in the dc load Z; (d), collector current $I_C$ in the transistor $Q_2$; (e), voltage $V_{NS}$ across the secondary winding $N_S$; and (f), voltage $V_R$ across the resistor R. The circuit shown in FIG. 11 operates in the following manner. At timing $t_0$, a gate signal $V_G$ is applied to the thyristor CR from the control device GCU. The thyristor CR is turned on by the signal $V_G$, and load current $I_Z$ flows by way of the dc power source $E_B$, the dc load Z, the primary winding $N_P$ of transformer CT, and the thyristor CR. At the same time, the law of isoampere turn holds on the transformer CT whereby an electromotive force is induced across the secondary winding $N_S$, the polarity of the emf being positive on the side indicated by the dot. The resultant secondary current, $(n_p/n_s) \times I_M$, flows by way of the secondary winding $N_S$, the resistor R, and the diode $D_2$. (Note: $I_M$ denotes a load current, and $n_s$ and $n_p$ the numbers of turns of secondary and primary windings $N_S$ and $N_P$ respectively. In this circuit, the excitation current for the transformer CT is neglected.) A given time after the thyristor CR turns on, the control device GCU supplies a voltage $V_B$ (FIG. 12(b)) to the base of transistor $Q_1$, which is thereby turned on. As a result, a current flows in the base of transistor $Q_2$ from the dc power source $E_B$ by way of the emitter-collector of transistor $Q_1$, the secondary winding $N_S$, and the resistor R. An electromotive force $V_S'$ is induced across the secondary winding $N_S$, having its negative pole on the side indicated by the dot. Since this emf is opposite to the foregoing emf $V_S$, the transformer CT is reset and the secondary winding current $I_S$ is limited to a value $(n_p/n_s) \times I_M$. When the current ratio $\alpha$ ($= n_s/n_p$) is determined to be $\beta > \alpha$ where $\beta$ is the current amplification factor of transistor $Q_2$, then the transistor $Q_2$ becomes conducting to the saturation region. The collector-emitter saturation voltage $V_{CES}$ is determined to be lower than the forward voltage $V_F$ of thyristor CR. Therefore the load current $I_M$ is commutated from the thyristor CR to the transistor $Q_2$. When the period for which the load current is commutated, i.e., the period for which the base voltage $V_B$ is present at the transistor $Q_1$, is determined to be longer than the period for which the thyristor CR turns off, then the thyristor can be turned off within the commutation period.

When the base voltage $V_B$ (FIG. 12(b)) is cut off at timing $t_2$, the transistor $Q_1$ turns off and the load current $I_Z$ is diverted to the freewheel diode $D_1$ through the primary winding $N_P$ by the inductive component of the dc load Z. An electromotive force is induced across the secondary winding $N_S$, having its positive polarity on the side indicated by the dot. Thus, according to the law of isoampere turn, a secondary current in value $(n_p/n_s) \times I_M$ flows by way of the secondary winding $N_S$, the resistor R and the diode $D_2$. A gate signal $V_G$ is applied again to the thyristor CR at timing $t_3$ after the lapse of a given period for which the thyristor is off. Repeating a series of the above operations, the circuit operates as a chopper control device.

In the chopper control device of the invention, as described above, the need for the conventional commutation capacitor is obviated. Furthermore, during load current commutation, the base current for the commutation transistor $Q_2$ may be minimum corresponding to the load current $I_M$ because the law of isoampere turn holds on the transformer CT. This base current is supplied for a very short period slightly longer than the turn-off time of the thyristor CR. This makes it possible to reduce loss attendant on commutation, increase the efficiency of the device and construct the device into a small size. Furthermore, by measuring the voltage across the resistor R, the load current can be detected efficiently and accurately owing to the fact that the current flowing in the resistor R is always $(n_p/n_s)$ times the load current. The detected result is utilized for controlling the main circuit. Accordingly the need for the conventional current detector is obviated and the device can be constructed into a smaller size and manufactured at low costs.

The load current can be supplied continually in the following manner. The transistor $Q_1$ is turned on for a give period at regular intervals. While the transistor $Q_1$ is on or immediately when the transistor $Q_1$ is turned off, a signal is applied to the gate of thyristor CR. Assume the reset cycle corresponds to the turn-on time of transistor $Q_1$. Then the turn-on period and intervals of transistor $Q_1$ are determined so that the transformed core flux is reset and set repeatedly during on and off times to prevent the core from being saturated. For this purpose, a third winding is installed on the transformer CT and a voltage induced across the third winding is monitored. Disappearance of this voltage at each polarity indicates that the core is saturated.

Referring to FIG. 13, there is shown a circuit diagram for illustrating another embodiment of the invention in which the transformer CT is provided with a second primary winding $N_{P2}$, and the current flowing in the thyristor CR is commutated securely and quickly by using an emf induced across the second primary winding $N_{P2}$ to reversely biasing the thyristor CR. Like constituent components are indicated by the identical references in FIGS. 11 and 13. The circuit in FIG. 13 comprises a current transformer having a first primary winding $N_{P1}$ and a second primary winding $N_{P2}$ with one end connected to the collector of commutation transistor $Q_2$. The junction between the two primart windings $N_{P1}$ and $N_{P2}$ is connected to the anode of thyristor CR and to the anode of freewheel diode $D_1$. The transformer CT has a first secondary winding $N_{S1}$ and a second secondary winding $N_{S2}$. This chopper control device operates in the following manner. When a gate signal voltage $V_G$ is supplied to the thyristor CR from the control device GCU, the thyristor CR becomes conducting between the anode and the cathode, allowing a load current $I_Z$ to flow from the dc power source $E_B$ by way of the dc load Z, the first primary winding $N_{P1}$ and the thyristor CR. The current in the first secondary winding $N_{S1}$ flows by way of the resistor R and the diode $D_2$, being in the value $(n_{p1}/n_{s2}) \times I_Z$. The control device GCU supplies an 'off' base voltage $V_B$ to the transistor $Q_1$. This makes the base current of transistor $Q_2$ ready to flow by way of the dc power source $E_B$, the transistor $Q_1$, the second secondary winding $N_{S2}$, the first secondary winding $N_{S1}$ and the resistor R. At this moment, an electromotive force $V_{P2}$ is induced across the second primary winding $N_{P2}$, having its negative polarity on the side indicated by the dot in FIG. 13. The thyristor CR is reversely biased by the emf $V_{P2}$, causing the load current $I_Z$ to be commutated to the transistor $Q_2$. When the commutation begins, the current ratio is lowered by the second primary winding $N_{P2}$ until the thyristor CR becomes turned off. As a result, the base current in the transistor $Q_2$ is to become increasing. However, because of the second secondary winding $N_{S2}$, the secondary winding of the transformer CT, is formed so that the primary-secondary current ratio becomes the same with that in the OFF state of the transistor $Q_1$. Therefore the transistor $Q_2$ quickly turns on and, after commutation, the base current (i.e., the secondary winding current) becomes $$\frac{n_{p1} + n_{p2}}{n_{s1} + n_{s2}} \times I_r$$

Therefore, when the relationship between the number of turns of the primary winding and that of the secondary winding is $$\frac{n_{p1}}{n_{s1}} = \frac{n_{p2}}{n_{s2}},$$

the current flowing in the resistor R is kept always to the value $(n_{p1}/n_{s1}) \times I_Z$. Hence the load current can be detected by measuring the voltage across the resisitor R.

As described above, the chopper control device in FIG. 13 is advantageous over the conventional device in that the need for the conventional commutation capacitor is eliminated and thus the device can be constructed into a small size and manufactured at low costs. Furthermore, loss attendant on commutation can be reduced and the operating efficiency can be increased. Still further, the load current can be detected efficiently and securely by the simple arrangement without the use of a particular current detector, and the main circuit can be controlled by the detected result.

Another embodiment of the invention, relating to a semiconductor switch using a thyristor and a transistor, will be descriged below. The turn-off characteristic of the switch is improved according to the invention. Referring to FIG. 14, there is shown a circuit diagram of prior art semiconductor switch, which comprises a thyristor 1 serially inserted in power path X-Y of main circuit network 100, and a transistor 2 connected in parallel to the thyristor 1. The load current $I_L$ is passed through the thyristor normally. To turn off the thyristor, the transistor 2 is turned on by a pulse from base drive source 3, and the load current $I_L$ is once commutated to the transistor 2. At this moment, when the voltage drop across the collector and the emitter of the transistor 2 is sufficiently lower than the threshold voltage of the thyristor 1, the thyristor 1 turns off. By cutting off the pulse base current to the transistor 2 after the thyristor 1 has been turned off, the load current which has been diverted to the transistor 2 is cut off.

In this prior art switch when used for large power, the voltage drop in the transistor can hardly be reduced to a sufficiently low voltage needed for the thyristor to self-turn off (or turn-off by lowering the voltage drop in the transistor below the holding current thereof). In other words, it has been virtually impossible to obtain a transistor in which the collector saturation voltage is very low, the collector current is large and the collector emitter peak reverse voltage $V_{CEO}$ is high. Furthermore, because of the presence of inductance along wiring the circuit (closed loop) having in parallel the transistor 2 and the thyristor 1, the commutation of the load current $I_L$ to the transistor 2 accompanies a delay (several microseconds to several hundred microseconds); the larger the load current, the longer becomes the delay. This is why the prior art semiconductor switch shown in FIG. 14 is not suited for large power applications. Whereas the invention provides an improved semiconductor switch in which the thyristor is efficiently turned off by the use of a transistor.

FIGS. 15(a) and 15(b) are circuit diagrams of semiconductor switches of the invention. There is provided a transformer (i.e., saturable transformer or pulse transformer, which may be a voltage or current transformer) having a secondary winding $N_2$ inserted serially in the collector path of transistor 2. A pulse drive means 300 is provided for driving the base of transistor 2 through the primary winding $N_1$ of the transformer. The pulse drive means 300 comprises an auxiliary power source 301 which may be common to a power source 101 of main circuit 100, a solid state switch 302 such as transistor, and a negative voltage limiting means 303 such as varistor, nonlinear resistance element, series of diode and zener diode, or voltage clipping means having a diode and a dc voltage source in reversely serial relationship. The negative voltage limiting means 303 limits the voltage in the direction indicated by the signs $\oplus$ and $\ominus$ in FIG. 15(a).

FIG. 15(b) shows another arrangement according to the invention, in which the pulse drive means 300 comprises a power source 301, a charging impedance 304, a charging/discharging capacitor 305, and a solid state switch 302 such as thyristor. In this example, the capacitor 305 serves also as the negative voltage limiting means 303.

The basic operation of the circuit shown in FIG. 15(a) will be described by referring to waveform chart in FIG. 17. When the thyristor 1 is fired, the load current $I_L$ flows in the thyristor 1. This current corresponds to part $I_{CR}$ of waveform (a). At the same time, forward voltage drops $V_{AK}$ across the thyristor 1 and $V_{CE}$ across the transistor 2 occur in the waveforms (d) and (e) for the period $t_1 - t_2$ in FIG. 17. A positive pulse voltage $V^{\oplus}_{300}$ is applied from the pulse drive means 300 whereby a positive pulse voltage $V^{\oplus}_{N2}$ is induced across the secondary winding $N_2$ (FIG. 17(b) and (c) for the period $t_2 - t_3$). As a result, the transistor 2 turns on and the load current $I_L$ is diverted to the transistor 2. In this state, the base current $I_B$ of the transistor 2 (i.e., the primary winding current $i_{N1}$) is expressed as follows according to the law of isoampere turn.

$$I_B = i_{N1} \approx \frac{N_2}{N_1} I_{TR} = \frac{N_2}{N_1} I_L \tag{1}$$

The base current $I_B$ is in the waveform (f) in FIG. 17, being proportional to the load current. While the primary and secondary voltages $V^{\oplus}_{N1}$ and $V^{\oplus}_{N2}$ are given as $$V^{\oplus}_{N1} = V^{\oplus}_{300} - V_{BE(2)} \ldots \tag{2a}$$

$$V^{\oplus}_{N2} = \frac{N_2}{N_1} V_{N1} \tag{2b}$$

where $V_{BE(2)}$ is the base-emitter voltage drop in transistor 2. The anode-cathode voltage $V_{AK(1)}$ of thyristor 1 is expressed as $$V_{AK(1)} = V^{\oplus}_{N2} - V_{CE(2)} \quad 0 \ldots \tag{3}$$

where $V_{CE(2)}$ is the collector-emitter voltage drop in transistor 2. These voltages are in waveforms (d) and (e) for the period $t_2 - t_3$ in FIG. 17. In this state, the voltage $V_{AK(1)}$ can be maintained nearly zero or negative and hence the current in the thyristor 1 is quickly or readily commutated to the transistor 2 to enable the thyristor 1 to be readily turned off. In other words, the secondary voltage $V^{\oplus}_{N2}$ to offset or overcome the forward voltage drop $V_{CE(2)}$ in transistor 2 can be inserted in the bypass path of the transistor. This secondary voltage serves to cause the base current in the transistor to respond in proportion to the load current.

Then, when the output of the pulse drive means 300 is cut off or made negative, the transformer 4 operates to cause the primary current $i_{N1}$ to keep flowing due to the secondary current $I_{TR}$. As a result, a negative voltage $V^{\ominus}_{300}$ appears at the pulse drive means 300 and negative voltages $V^{\ominus}_{N1}$ and $V^{\ominus}_{N2}$ across the primary and secondary windings respectively. These negative voltages bring about changes in the interlinkage flux, the changes being equal to those ascribed to the foregoing positive pulse voltage applied, at timing $t_4$, whereby the transformer is saturated. When the transformer is saturated, the primary current, i.e., the base current $I_B$ disappears. The above negative voltages are present for the period $t_3 - t_4$ in FIG. 17. The peak value of the negative voltage for the period $t_3 - t_4$ is limited by the negative voltage limiting means 303 comprised in the pulse drive means 300. Then the transistor 2 turns off with a delay of storage time $t_4 - t_5$. When the pulse drive means 300 uses a capacitor 305 as shown in FIG. 15(b), the pulse voltage changes gradually from positive to negative, resulting in a primary winding voltage $V_{N1}$ (or accordingly, secondary voltage $V_{N2}$ or output voltage $V_{300}$ of pulse drive means 300) in the waveform (g) in FIG. 17. At the same time, the voltage across the thyristor assumes a reverse sawtooth wave. Other circuit operations are the same as those of the one shown in FIG. 15(a).

According to the invention, as described in reference to FIG. 15, the collector-emitter voltage drop in the transistor 2 increases and the base current thereof responds in proportion to the load current and hence large power can be turned off with ease.

Referring to FIG. 16, there is shown a circuit diagram for illustrating another emboidment of the invention, which comprises a thyristor 1 and a transistor 2. The main electrode on the side opposite to the control electrode of thyristor 1, i.e., the anode in case of P-gate thyristor or the cathode in case of N-gate thyristor, is connected to the main electrode on the side opposite to the control electrode of transistor 2, i.e., the collector electrode. Specifically, when the thyristor 1 is of P-gate type, the transistor 2 is of NPN type. When the thyristor is of N-gate type, the transistor is of PNP type. In this embodiment, an NPN transistor and a P-gate thyristor are used. The arrangement that the two main electrodes are connected together makes it possible to use a heat sink for the thyristor and the transistor in common, house the two semiconductor devices in one package, form the two semiconductor devices on one semiconductor wafer, and reduce line inductance detrimental to commutation.

Referring to FIGS. 18(a) and 18(b), there are shown circuit arrangements of transistor 2 and thyristor 1 according to other embodiments of the invention. In FIG. 18(a), a thyristor wafer $1_1$, and a transistor wafer $2_1$ are installed on a thermally conducting substrate 41 which serves also as the two main electrodes (i.e., the collector of transistor $2_1$ and the anode of P-gate or the cathode of N-gate thyristor $1_1$) connected in common. These semiconductor elements are housed in one package. This semiconductor comprises a cap 42, a thyristor main electrode 43 on the side of main electrode, a transistor main electrode 44 on the side of control electrode, a thyristor control electrode 45, a transistor control electrode 46, and lead wires for interconnections between electrodes and elements on the semiconductor wafer. This construction is advantageous in that the semiconductor elements can be mounted in common on the thermally conducting substrate 41 (e.g., copper substrate) on which the cap 42 is mounted.

FIG. 18(b) is a sectional view conceptually showing the construction of a semiconductor device comprising a thyristor region and a transistor region formed in common on a semiconductor wafer. A (PNPN/PνPN) P-gate thyristor is used with an NPN transistor, or a (NPNP/NνNP) N-gate thyristor is used with a PNP transistor. In the shown construction, the numerals 201, 202, 203 and 204 denote semiconductor layers corresponding to P-N-P-N or N-P-N-P layers where the suffix 'a' indicates the thyristor region, and 'b' the transistor region. Further comprising are common contact 211 on the side opposite to the control electrode, main electrode contact 212 of the thyristor on the side of control electrode, control electrode contact 213 of the thyristor, emitter contact 214 of the transistor, and base contact 215 of the transistor. In this construction, therefore, the semiconductor elements can be installed in common on a semiconductor wafer.

According to the invention, as has been described above, the load current can readily be commutated from the thyristor to the transistor by virtue of the arrangement that a series circuit of the transformer secondary winding and the transistor is connected in parallel to the thyristor, and the transistor base is driven by a pulse drive means serially through the transformer primary winding. Furthermore, the package construction can be simplified by interconnecting in common the main electrodes of the thyristor and transistor on the side opposite to the control electrodes. This construction permits the device to be used as a semiconductor switch unit with ease and efficiency.

While specific embodiments of the invention have been described, it is to be understood that numerous variations may occur to those skilled in the art without departing from the true spirit of the invention.

What is claimed is:

1. A chopper control device comprising: a transformer having a primary winding and a secondary winding; a series circuit including a dc power source, a dc load, the primary winding of the transformer for detecting a load current, and a thyristor; a normally non-conductive transistor connected in parallel to said thyristor; wherein the secondary winding of the transformer is connected to the dc power source and means connected between the secondary winding of the transformer and the base of the transistor for deriving a current from said secondary winding and supplying it to the base of said transistor to render the transistor conductive and provide a short-circuit around the thyristor.

2. The chopper control device according to claim 1 wherein the current deriving means includes another transistor connected in series to the secondary winding of said transformer, through which transistor a current is supplied to the base of said transistor.

3. The chopper control device according to claim 1 wherein a commutation diode is connected in parallel to said dc load.

4. A chopper control device comprising: a series circuit having a dc power source, a dc load, and a thyristor; a transistor connected in parallel to said thyristor; a transformer having a primary winding used for detecting the load current and a secondary winding; and means for deriving a current from said secondary winding and supplying it to the base of said transistor wherein said transformer is provided with a third winding in series to the primary winding, and commutation operation is secured by an electromotive force induced across said third winding at commutation.

5. The chopper control device as claimed in claim 1 wherein said transistor and said thyristor have their main electrodes connected in common on the side opposite to their control electrodes.

6. The chopper control device according to claim 1 wherein said transistor and said thyristor are housed in common in a package.

7. A chopper control device comprising: a series circuit having a dc power source, a dc load, and a main control thyristor; a commutation transistor connected in parallel to said main control thyristor; a capacitor connected to said dc load for charging; a transformer having a primary winding used for detecting the load current and a secondary winding; and means for deriving a charge from said capacitor and supplying the charge to the base of said transistor.

8. The copper control device according to claim 7 wherein said transformer is provided with a winding capable of causing a reverse voltage to be applied to said main control thyristor, said winding being connected in series to said commutation transistor.

9. The chopper control device according to claim 7 wherein the charge deriving and supplying means includes an auxiliary transistor connected to the base circuit of said commutation transistor for controlling the base current in said commutation transistor.

10. A chopper control device comprising: a transformer having a core, a primary winding, a secondary winding and a reset winding; a series circuit including a dc power source, a dc load, the primary winding of the transformer, and a normally non-conductive transistor; a thyristor connected in parallel to said transistor; means for deriving a current from said secondary winding and supplying it to the base of said transistor to render the transistor conductive and provide a short-circuit around the thyristor; means for passing current through said reset winding when said transistor is non-conducting and thus resetting the core of said transformer; and means for supplying a current to the secondary winding of said transformer.

11. A chopper control device comprising: a series circuit having a dc power source, a dc load, and a thyristor; a transistor connected in parallel to said thyristor; a transformer having a first primary winding connected in series to said series circuit and used for detecting the load current, and a first secondary winding with one end connected to a switching element and the other end connected to a resistor; a diode connected in parallel to a series circuit having said first secondary winding and said resistor; and a means for supplying a current to the base of said transistor from said dc power source through said switching element and said series circuit having the first secondary winding and said resistor and for supplying a signal to the gate of said thyristor.

12. The chopper control device according to claim 11 wherein said transformer is provided with a second primary winding and a second secondary winding, and said second primary winding is connected in series to said transistor.

13. A chopper control device comprising: a transformer having a primary winding and a secondary winding; a normally non-conductive transistor having one of its main electrodes connected in series to said secondary winding and its control electrode connected to one end of said primary winding; a thyristor connected across the series combination of said transistor and said secondary winding; and pulse drive means connected to the other end of said primary winding for driving the base of said transistor to render the transistor conductive and provide a short circuit around the thyristor.

14. A chopper control device as claimed in claim 13 wherein said transistor and said thyristor have their main electrodes connected in common on the side opposite to their control electrodes.

15. The chopper control device according to claim 14 wherein said transistor and said thyristor are housed in common in a package.

16. A chopper control device comprising: a transformer having a primary winding and a secondary winding; a series circuit including a first dc power source, a dc load, the primary winding of the transformer for detecting a load current, and a thyristor; a normally non-conductive transistor connected in parallel to said thyristor; wherein the secondary winding of the transformer is connected to a second dc power source and means connected between the secondary winding of the transformer and the base of the transistor for deriving a current from said secondary winding and supplying it to the base of said transistor to render the transistor conductive and provide a shortcircuit around the thyristor.

17. The chopper control device according to claim 16 wherein the current deriving means includes another transistor connected in series to the secondary winding of said transformer, through which transistor a current is supplied to the base of said transistor.

18. The chopper control device according to claim 16 wherein a commutation diode is connected in parallel to said dc load.

19. The chopper control device as claimed in claim 16 wherein said transistor and said thyristor have their main electrodes connected in common on the side opposite to their control electrodes.

20. The chopper control device according to claim 16 wherein said transistor and said thyristor are housed in common in a package.

* * * * *